(12) United States Patent
Co

(10) Patent No.: US 7,797,583 B2
(45) Date of Patent: *Sep. 14, 2010

(54) FAULT DIAGNOSIS OF SERIALLY-ADDRESSED MEMORY MODULES ON A PC MOTHERBOARD

(75) Inventor: Ramon S. Co, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 426 days.

This patent is subject to a terminal disclaimer.

(21) Appl. No.: 12/036,985

(22) Filed: Feb. 25, 2008

(65) Prior Publication Data

US 2009/0217093 A1 Aug. 27, 2009

(51) Int. Cl.
  *G06F 11/00* (2006.01)
(52) U.S. Cl. .................. 714/42; 714/25; 714/718
(58) Field of Classification Search ............ 714/42, 714/25, 718
  See application file for complete search history.

(56) References Cited

U.S. PATENT DOCUMENTS

| | | | |
|---|---|---|---|
| 4,556,840 A | 12/1985 | Russell | |
| 5,155,844 A | 10/1992 | Cheng et al. | |
| 5,539,912 A | 7/1996 | Clarke, Jr. et al. | |
| 5,704,035 A | 12/1997 | Shipman | |
| 5,850,562 A | 12/1998 | Crump et al. | |
| 6,055,653 A | 4/2000 | LeBlanc et al. | |
| 6,357,022 B1 | 3/2002 | Nguyen et al. | |
| 6,467,053 B1 | 10/2002 | Connolly et al. | |
| 7,165,002 B2 | 1/2007 | Adler | |
| 7,234,081 B2 | 6/2007 | Nguyen et al. | |
| 2002/0032537 A1 | 3/2002 | Hunter | |
| 2003/0051193 A1 | 3/2003 | Pham | |
| 2004/0216011 A1 | 10/2004 | Co et al. | |

*Primary Examiner*—Scott T Baderman
*Assistant Examiner*—Jigar Patel
(74) *Attorney, Agent, or Firm*—Stuart T. Auvinen; g Patent LLC

(57) ABSTRACT

A test adaptor board connects to a personal computer (PC) motherboard that tests a memory module in a test socket. A standard memory module socket is removed from a target DRAM module slot on the component side and the test adaptor board connects to the target DRAM module slot on the reverse (solder) side of the motherboard. The target DRAM module slot is a middle slot, such as the second or third of four DRAM module slots. The first and fourth DRAM module slots are populated with known good memory modules storing the BIOS at a high address and an operating system image and a test program at a low address. The test program accesses a memory module in the test socket to locate defects. The motherboard does not crash since the BIOS, OS image, and test program are not stored in the memory module under test.

20 Claims, 10 Drawing Sheets

PRIOR ART

FRONT SIDE

ALL 128 MEG DRAMS

INTERLEAVED DRAM - MOTHERBOARD CRASHES

US 7,797,583 B2

FAULT DIAGNOSIS OF SERIALLY-ADDRESSED MEMORY MODULES ON A PC MOTHERBOARD

RELATED APPLICATIONS

This application may be related to U.S. Ser. Nos. 11/308,869, 11/309,297, 11/309,298, 11/944,551, and U.S. Pat. No. 7,277,337, having a common assignee and at least one inventor in common, but presenting patentably distinct claims.

FIELD OF THE INVENTION

This invention relates to memory module testers, and more particularly to personal-computer motherboard-based memory testers.

BACKGROUND OF THE INVENTION

A wide variety of electronic systems use memory modules. Personal computers (PC's) use memory modules as the main memory on the PC motherboard. Memory modules are built to meet specifications set by industry standards, thus ensuring a wide potential market. High-volume production and competition have driven module costs down dramatically, benefiting buyers of a wide variety of electronic systems.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

FIG. 1 shows an illustration of a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 could be a fully-buffered dual-inline memory module (FB-DIMM) that is fully buffered by an Advanced Memory Buffer (AMB) chip (not shown) on memory module 10. The AMB chip uses differential signaling and packets to transfer data at high rates.

Memory modules without an AMB chip are still being made. Such unbuffered memory modules carry address, data, and control signals across metal contact pads 12 from the motherboard directly to DRAM chips 22. Some memory modules use simple buffers that buffer or latch some of these signals but do not use the more complex serial-packet interface of a FB-DIMM.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module.

PC-Based Memory-Module Tester—FIG. 2

FIG. 2 shows a memory-module tester that is constructed from a personal computer PC motherboard. See for example U.S. Pat. Nos. 6,357,022, 6,351,827, and 6,742,144.

While memory modules could be manually inserted into a memory module test socket on the tester, a memory-module handler that automates insertion and removal of memory modules is desirable. Handler 60 is mounted close to the backside of the PC motherboard using handler adaptor board 50. Handler 60 is not drawn to scale since it is several times larger than a PC motherboard.

Handler 60 is mounted by reverse attachment to the solder-side of the PC motherboard rather than to the component-side of the PC motherboard. The memory module socket on the component side of the PC motherboard is removed, and handler adapter board 50 is plugged from the backside into the holes on the PC motherboard for the memory module socket. Handler adapter board 50 is a small epoxy-glass circuit board designed to interface a handler to a PC motherboard.

Contactor pins 66 within handler 60 clamp down onto leadless pads on the edge of module-under-test MUT 70 when arm 76 pushes MUT 70 into place for testing. Contactor pins 66 include enough pins for all power, ground, and I/O leads on MUT 70.

Contactor pins 66 are electrically connected to connectors on the backside of handler 60. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be directly soldered to PC motherboard substrate 80 using the holes exposed when the memory-module socket was removed, or adaptor pins 52 can be plugged into female pins 55 that are soldered onto solder-side 84 of the PC motherboard. Female pins 55 have extensions that fit into the through-holes exposed by removal of the SIMM socket, but also have cup-like receptacles for receiving adaptor pins 52. Using female pins 55 allows handler adaptor board 50 to be easily removed from substrate 80.

Once MUT 70 has been tested by a test program running on the PC motherboard, MUT 70 is sorted and drops down into either good bin 72 or bad bin 74. Sorting is in response to a pass/fail signal from the test program running on the PC motherboard.

Substrate 80 of the PC motherboard is a conventional multi-layer epoxy-fiberglass circuit board. Components 92, 94 are mounted on component-side 82 of substrate 80. Memory modules 87 fit into memory module sockets 88 that have metal pins that fit through holes in substrate 80. These pins are soldered to solder-side 84 of substrate 80 to rigidly attach sockets to the PC motherboard. Expansion cards 96 are plugged into expansion sockets that are also mounted onto component-side 82 of substrate 80. Cables 98 that are plugged into expansion cards 96 connect peripherals such as disk drives, video display monitors, and multimedia devices to the PC.

Since the memory module tester is constructed from an inexpensive PC motherboard, the cost of the tester is several orders of magnitude smaller than the cost of a million-dollar automated-test-equipment (ATE) machine. Thus test costs are significantly reduced by using a PC-motherboard-based tester. Many different test patterns may be applied to the memory module under test, and the voltages and temperature may be varied to perform corner testing. Hot or cold air may be blown onto the memory module under test by a nozzle (not shown), while the voltage applied to the memory module under test may be adjusted by handler adaptor board 50 or by the PC motherboard.

FIG. 3 shows electrical wiring on a memory module. Memory module 10 has connector 32 that mates with a memory module socket on motherboard 28. Memory module 10 is an unbuffered memory module with DRAM address signals A13:0, bank addresses BA1:0, and other control signals such as RAS, CAS, WE, and any clock or clock-enable signals passing directly through connector 32.

Most of these signals from connector 32 pass directly to DRAM chips 40 over traces 34 on the substrate of memory module 10. Both row and column addresses are input through multiplexed address lines. The row address is applied to the address lines, then RAS is driven low and DRAM chips 40 latch in the row address and begin accessing all columns in the row. Then the column address is applied to the same address lines, and CAS is driven low. DRAM chips 40 use the column address to select one of the columns of data in the selected row.

A few bank address inputs such as BA1:0 may also be supported. Bank addresses are not multiplexed and are usually applied with the row address. Bank addresses might select one of several memory arrays within the DRAM chip.

Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module.

During initialization, the host processor on motherboard 28 reads the configuration from SPD-EEPROM 130. The configuration information about memory module 10 is sent over serial data line SPD_D synchronized to SPD clock SPD__CLK. Address inputs to SPD EEPROM 130 are carried from motherboard 28 on address lines SPD_A[2:0], which may be hard wired on motherboard 28. The wiring configuration of SPD_A[2:0] on motherboard 28 determines the device address (memory-module slot number) of memory module 10. Data sent over serial data line SPD_D is a series of frames consisting of device address, device type, register location, and register data.

DRAM chips may have a very large capacity, such as 512 Mbits, or half a giga-bit. The large number of memory cells, small size of individual memory cells, and overall large area of the DRAM die cause manufacturing defects to be somewhat common. DRAM chips are tested on a wafer before being separated and packaged, but this wafer-sort test may not catch all defects.

Thus some packaged DRAM chips are going to contain defects. Further testing of packaged DRAM chips may be performed cost-effectively at higher speeds, allowing defective DRAM chips to be identified and discarded. Manufacturers may build DRAM chips into memory modules, then perform testing on a low-cost memory module tester constructed from a PC motherboard.

FIG. 4 shows a memory map of a PC motherboard with a test socket for testing memory modules at a low address. The memory space of the microprocessor on a PC motherboard has the basic input-output system (BIOS) mapped to the highest addresses in the memory space. The BIOS code may be read from a read-only memory (ROM) and copied to a memory module inserted into DRAM module slot 566 during booting. Later in the boot process, an image of the operating system (OS) is loaded into the lowest addresses in the memory space, in DRAM module slot 562.

A special test program used by the memory module manufacturer can be loaded into the memory module in DRAM module slot 562 after booting. DRAM module slot 562 can have installed in it a memory module under test that has been inserted into test socket 560 on a test adaptor board, rather than a memory module installed on the PC motherboard. However, when the memory module under test is faulty, defect 56 may occur in the test program or in the OS image, causing the PC motherboard to crash. Ideally, defect 56 is not in the memory portion assigned to DRAM module slot 562 that contains the OS image, but in another portion tested by the test program in DRAM module slot 562. Then the test program may crash, or it may report the failure.

However, when defect 56 in the memory modules device under test occurs in the portion of DRAM module slot 562 that contains the OS image, the PC motherboard is likely to crash during booting or just after booting. This is less desirable, since the test program cannot report the location of the faulty memory. The test system can still detect the error by the motherboard crashing, and can discard the memory module under test in test socket 560.

FIG. 5 shows a memory map of a PC motherboard with a test socket for testing memory modules at a high address. Rather than connect test socket 560 to low addresses of DRAM module slot 562, test socket 560 is connected to the terminals for DRAM module slot 566 on the motherboard. The memory module under test then contains the highest memory addresses in the PC.

Since the BIOS is copied to DRAM module slot 566, the BIOS is copied to the memory module under test. Should a faulty DRAM location occur where the BIOS is loaded, the PC motherboard may crash during booting before the test program is executed. This is undesirable since the exact location of defect 56 within the memory module under test cannot be readily determined. However, the test system can still detect the error by the motherboard crashing, and can discard the memory module under test in test socket 560.

It is often desirable to find the exact location of the defect within a memory module. For example, if the defect location is known, then the DRAM memory chip containing this defect can be removed from the memory module substrate, and a new DRAM chip can be soldered onto the memory module in a rework process. This rework process can save the defective memory module.

Diagnosis of faults may be desired during development, such as to determine the cause of the fault. Statistics may be generated of fault locations to determine if a certain part of the memory module design is weak. A re-design of the memory module may then improve manufacturing yields.

What is desired is a PC motherboard tester that can determine the location of a defect in a faulty memory module. A motherboard tester that does not crash when a faulty memory module is being tested is desirable. A motherboard tester that can isolate a faulty memory location using a test program is desirable.

DETAILED DESCRIPTION

The present invention relates to an improvement in memory module testers and diagnosis tools. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that diagnosis of memory module failures can be aided by placing the memory module under test in the middle of the motherboard's address space. Two good memory modules are inserted into standard memory module sockets on the motherboard, while a third memory module socket is removed from the motherboard and the motherboard traces for this removed socket are instead connected to the test adaptor board. The memory module under test inserted into the test socket on the test adaptor board then connects to the motherboard traces for this removed memory module socket.

The removed memory module socket is for a middle portion of the motherboard's address space. The BIOS at the high addresses is loaded into one of the good memory modules while the OS image and test program at the low addresses are loaded into the other one of the good memory modules inserted in the standard memory module sockets on the motherboard. Thus the BIOS, OS image, and test program are loaded into known good memory modules. The possibly faulty memory module under test is mapped to the middle addresses in the address space that are not used for critical code that could crash the motherboard.

The motherboard can boot and execute the test program without crashing, even when the memory module under test is faulty. The test program can isolate the faulty memory located within the memory module under test and report this location to the tester system host or diagnosis equipment.

Figure 6:
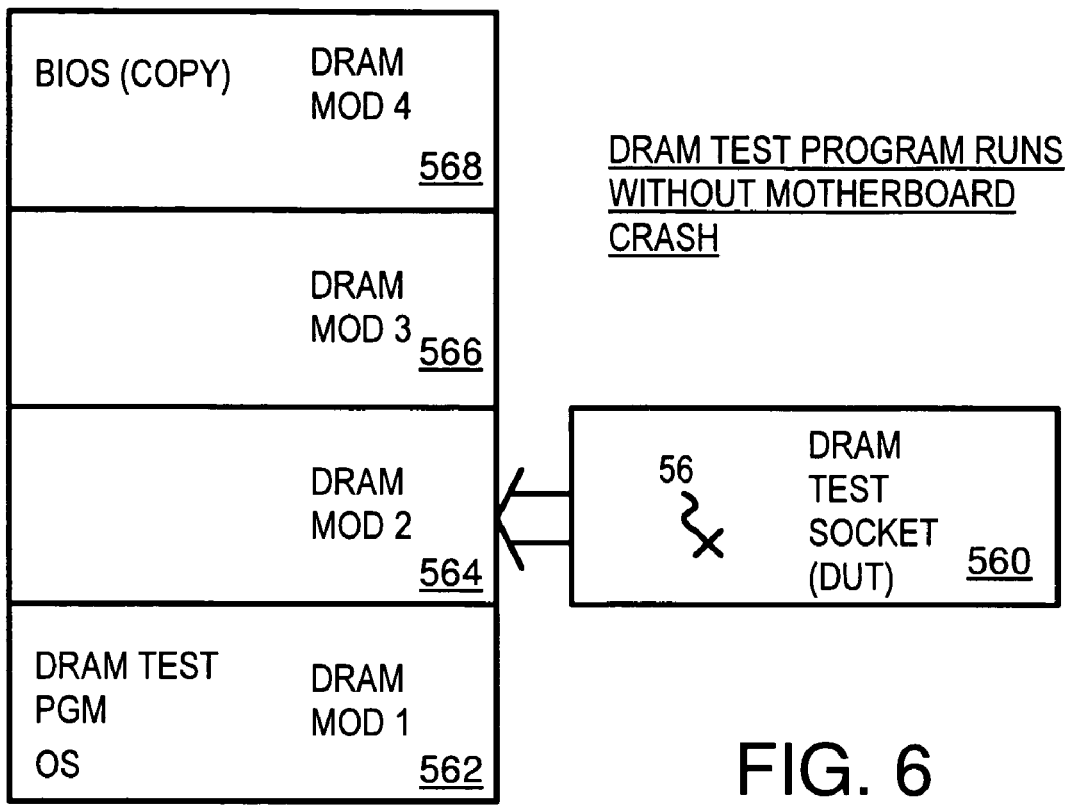
FIG. 6 shows a memory map of a PC motherboard with a test socket for testing memory modules at a middle address in a second module location.

FIG. 6 shows a memory map of a PC motherboard with a test socket for testing memory modules at a middle address in a second module location. The memory space of the microprocessor on a PC motherboard has the basic input-output system (BIOS) mapped to the highest addresses in the memory space. The BIOS code may be read from a read-only memory (ROM) and copied to DRAM module slot 568 during booting. Later in the boot process, an image of the operating system (OS) is loaded into the lowest addresses in the memory space, in DRAM module slot 562.

A special test program used by the memory module manufacturer can be loaded into the memory module connected to DRAM module slot 562 after booting. DRAM module slot 564 can connect to a memory module under test that has been inserted into test socket 560 on a test adaptor board reverse-mounted to the solder-side of the motherboard, rather than a memory module installed into a standard memory module socket on the component side of the PC motherboard.

When the memory module under test is faulty, the defect cannot occur in the test program or in the OS image, since these are stored in a known good memory module on the motherboard in DRAM module slot 562. The defect in the memory module device under test cannot occur in the BIOS copy, since the BIOS copy at the high address is stored in another known good memory module on the motherboard in DRAM module slot 568.

Since the BIOS copy, the OS image, and the test program are stored in known good memory modules, defect 56 in the memory module under test does not crash the motherboard. As long as good programming practices are followed for the test program, such as by having procedures in the test program to recover from an access to a faulty memory location in the memory module under test, the motherboard is unlikely to crash. The test program can locate the defect and report the location to a user, such as through a test system host or diagnosis host. The test program can write and read all memory locations in the memory module under test in test socket 560, which is connected to DRAM module slot 564.

The motherboard may contain three or four memory modules. When four modules are used, the third memory module location, DRAM module slot 566, may be populated with a known good memory module on a standard motherboard socket.

Figure 7:
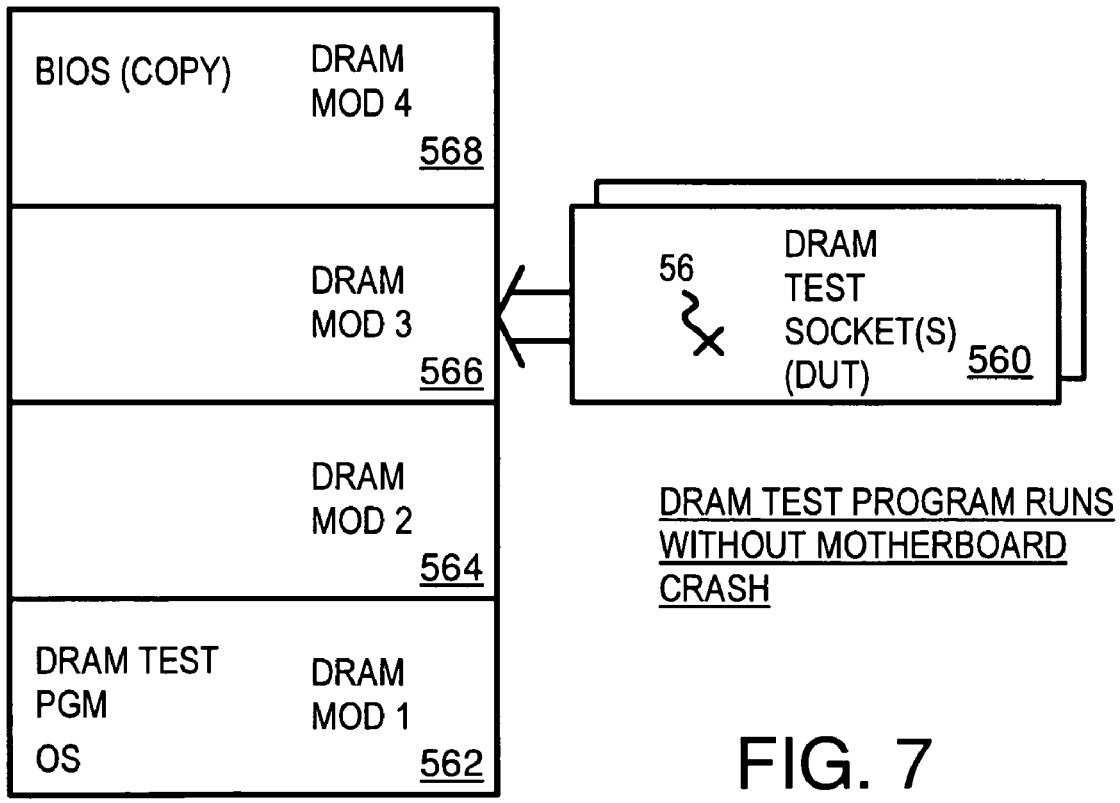
FIG. 7 shows a memory map of a PC motherboard with a test socket for testing memory modules at another middle address in a third module location.

FIG. 7 shows a memory map of a PC motherboard with a test socket for testing memory modules at another middle address in a third module location. In this alternative, the motherboard contains four memory-module socket locations: DRAM module slots 562, 564, 566, 568. All four slots are populated during testing. Known good memory modules are inserted into standard memory module sockets on the component side of the motherboard for DRAM module slots 562, 564, 568. Test socket 560 is connected through the test adaptor board to motherboard traces of third DRAM module slot 566.

Since the BIOS copy, the OS image, and the test program are stored in known good memory modules, inserted into first DRAM module slot 562 and into fourth DRAM module slot 568, defect 56 in the memory module under test does not crash the motherboard. The test program code is read from the memory module inserted into first DRAM module slot 562, and writes and reads memory locations in the memory module under test inserted into test socket 560, which is connected to third DRAM module slot 566. When defect 56 is located, the test program can record its exact location, and report the addresses of all defects to the host or user.

Test socket 560 may include more than one memory module test socket. Test socket 560 could contain two sockets, each for half-size memory modules under test. Test socket 560 could connect to two module locations on the motherboard, such as to both DRAM module slot 564 and to DRAM module slot 566.

BIOS Routines Configure DRAM Slots

During booting of the motherboard, the BIOS executes a series of routines before or after the BIOS is copied to high addresses in DRAM. The BIOS typically is stored in flash memory that can be updated with a hardware configuration of the motherboard. This hardware configuration may include information about the DRAM installed in the slots that was saved during a previous time that the motherboard was running.

Some BIOS routines perform a memory test. The BIOS may write a value to a memory address and then read that address to see if the data was retained. If the data matches, the BIOS assumes that DRAM is present at that address.

The BIOS may have a table of possible memory configurations. For example, the memory-configuration table may have one entry for when only the first slot is populated with a 1 G DRAM, another entry for when two slots are populated with 1 G DRAMs, another entry for when three slots are populated with 1 G DRAMs, etc. Some entries may be for mixed configurations, such as 1 G in slot 1, 512 M in slot 2, 4 G in slot 3, 4 G in slot 4. This table of allowable memory configurations is usually included in a help file or other documentation for the BIOS or motherboard.

The BIOS may automatically test a series of memory addresses during booting, and pick one entry in the memory-configuration table as the current configuration based on the results of the memory test. This auto-test feature may be disabled by running a BIOS setup program and disabling the feature. The BIOS setup program is usually available by pressing a certain key during booting, such as F5 or holding down the spacebar key on the PC keyboard. A message may appear on the display screen during booting telling the user what key to press to enter the BIOS setup program.

Figure 1:
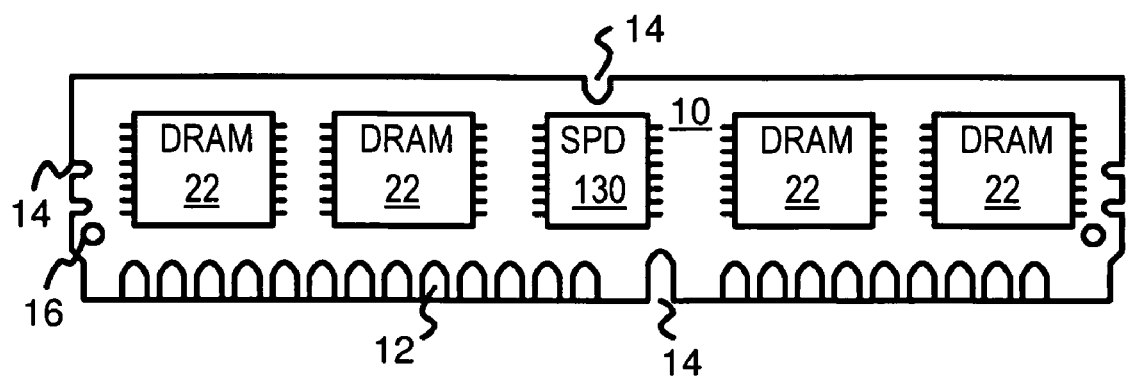
FIG. 1 shows an illustration of a fully-buffered memory module.
Figure 2:
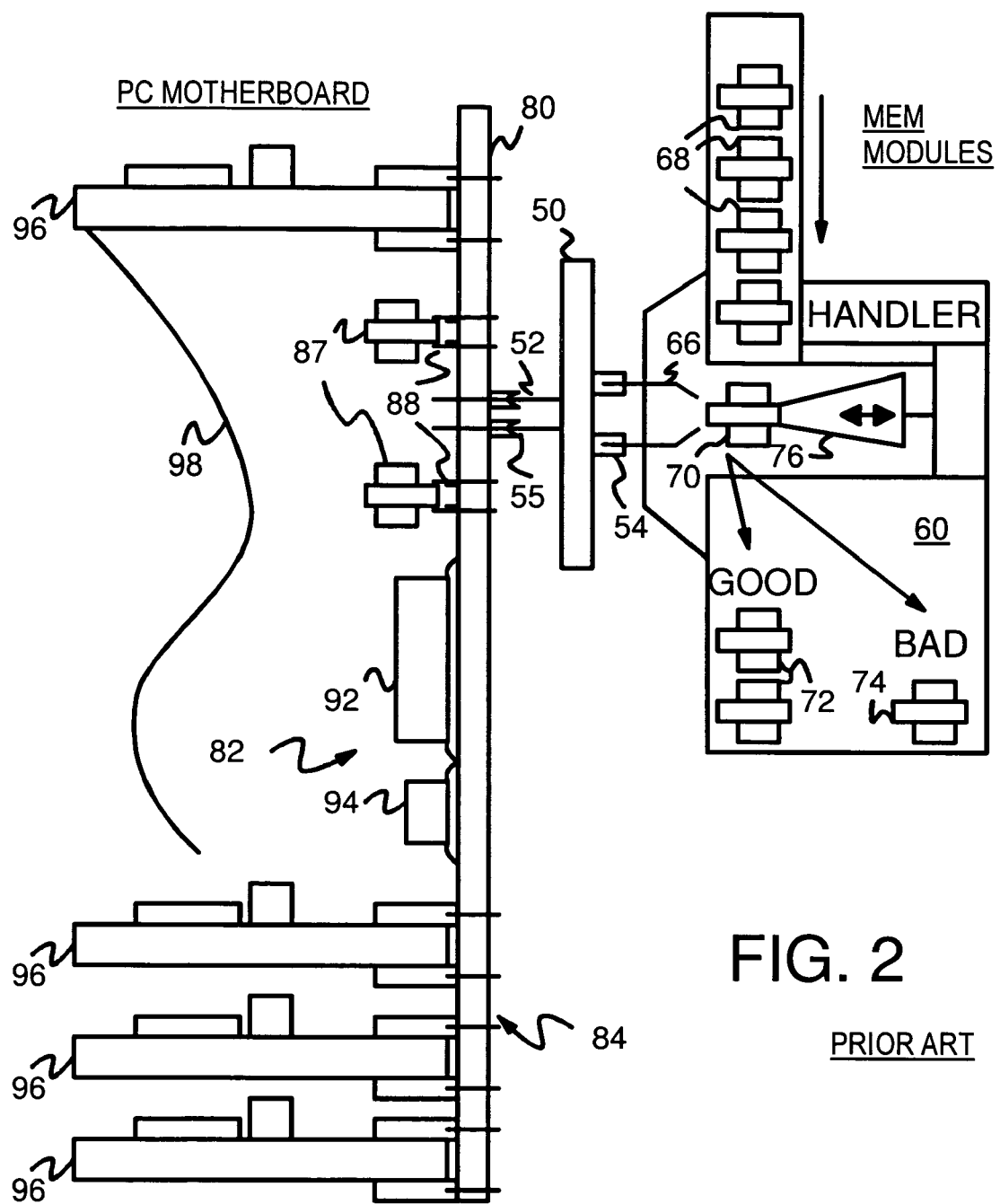
FIG. 2 shows a memory-module tester that is constructed from a personal computer PC motherboard.
Figure 3:
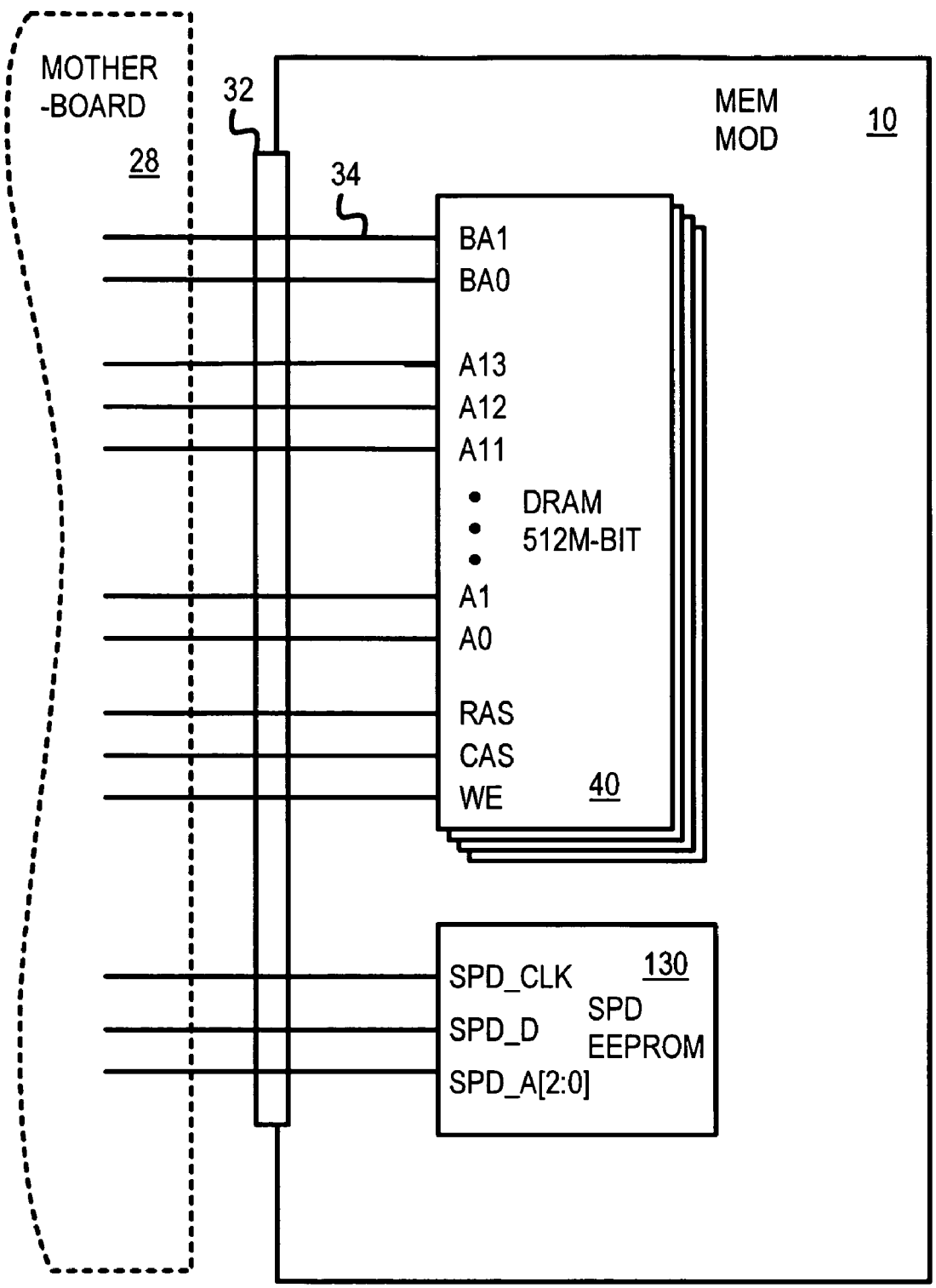
FIG. 3 shows electrical wiring on a memory module.
Figure 4:
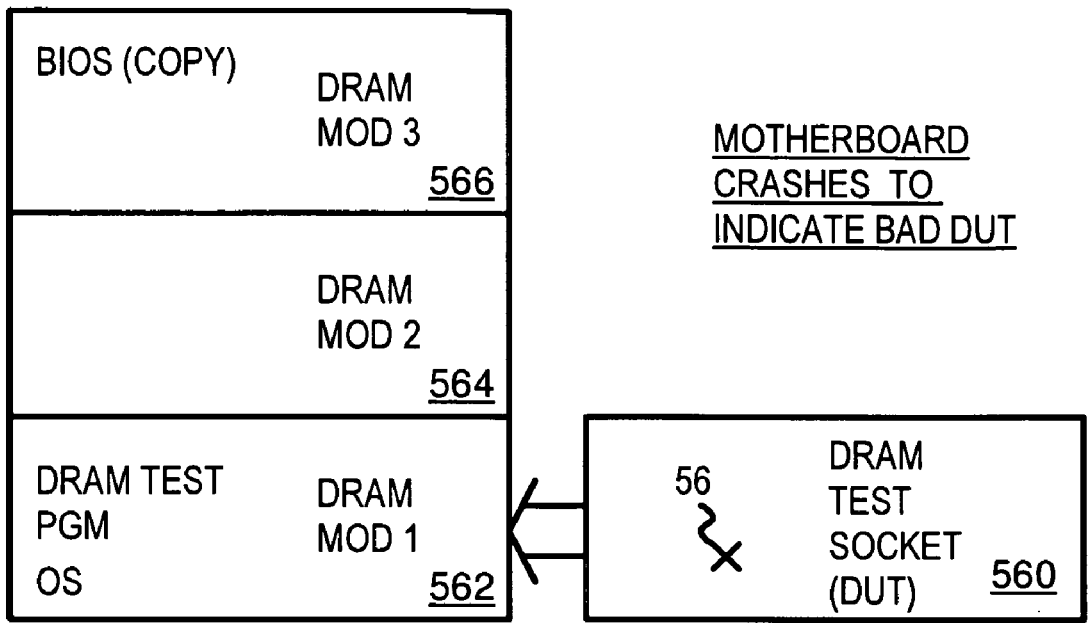
FIG. 4 shows a memory map of a PC motherboard with a test socket for testing memory modules at a low address.
Figure 5:
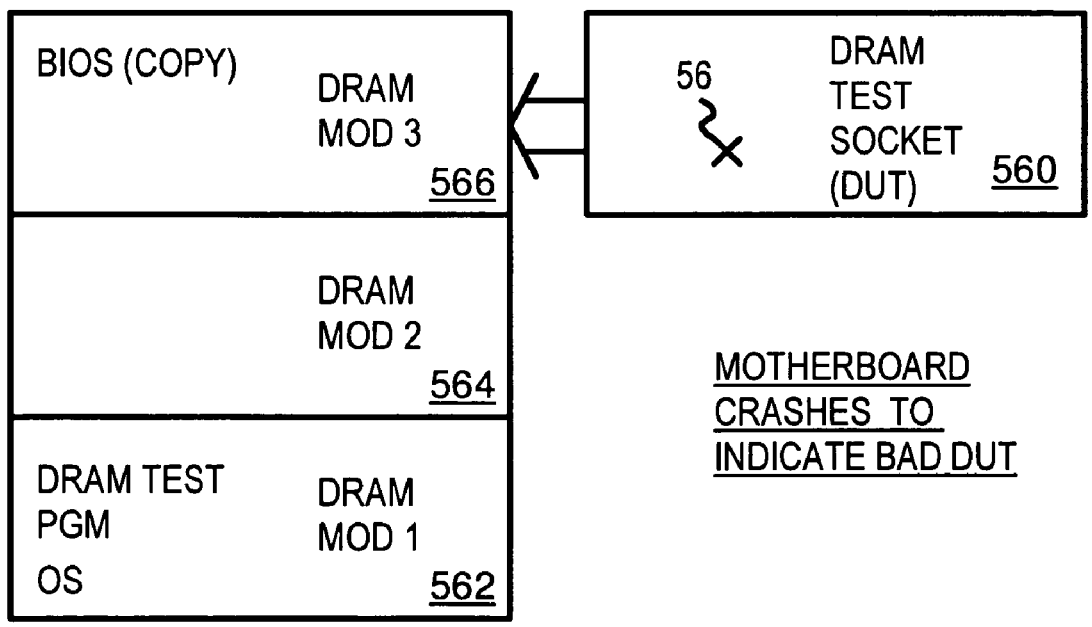
FIG. 5 shows a memory map of a PC motherboard with a test socket for testing memory modules at a high address.

The BIOS may also determine the current memory configuration by reading SPD-EEPROM 130 on each memory module, as described earlier for FIG. 3. Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module. The BIOS can read SPD-EEPROM 130 for each of the four memory modules in DRAM module slots 562, 564, 566, 568 and find an entry in the memory-configuration table that matches the data read from SPD-EEPROMs 130. When the memory auto-test feature is disabled, the BIOS uses this alternate method to configure the memory. A third alternative is to just use the last memory configuration before the motherboard was rebooted.

Disabling the memory auto-test feature in BIOS forces the BIOS to load the OS image into the first memory module, in first DRAM module slot 562. This is desirable, since it prevents the memory module under test in the second or third slots from being used as low addresses to store the OS image.

Figure 8A:
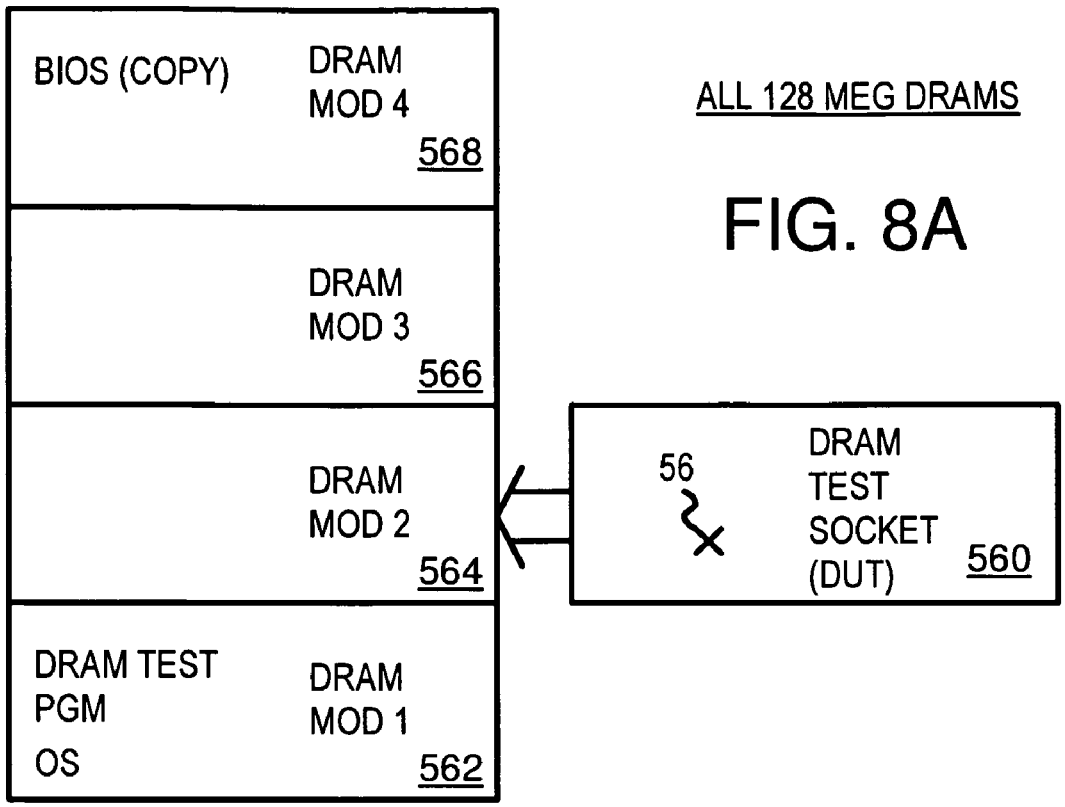
FIGS. 8A-B highlight a problem in testing memory modules when the BIOS configures the memory modules for interleaving.
Figure 8B:
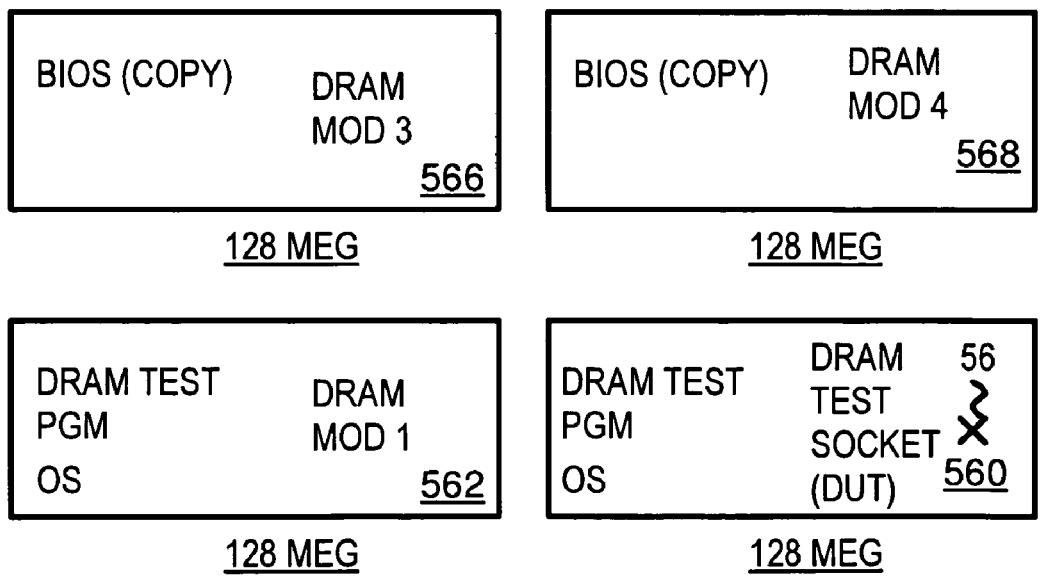

Interleaved DRAM Problem—FIGS. 8A-B

FIGS. 8A-B highlight a problem in testing memory modules when the BIOS configures the memory modules for interleaving. When all four DRAM module slots 562, 564, 566, 568 are populated with the same size of memory module, including the memory module under test inserted into test socket 560, the BIOS may chose an entry in its memory-configuration table that interleaves addresses among two or four memory modules.

In FIG. 8A, all four memory modules have the same size, using 128 M-bit DRAM chips. For memory modules with 8 such chips, the module capacity is 128 MB. The memory module under test, inserted into test socket 560, is also a 128 MB, so all four memory modules are the same size, 128 MB.

Rather than serially address the four memory modules, with test socket 560 being accessed as a middle address, the BIOS may choose an interleaved memory configuration. For 2-way interleaved memory configurations, addresses alternate between 2 memory modules. For example, addresses from 0 to 4K–1 may be routed to first DRAM module slot 562, while addresses from 4K to 8K–1 may be routed to second DRAM module slot 564. Successive 4K blocks (DRAM pages) are alternately accessed from alternate slots in a ping-pong fashion. Other page-interleave sizes are possible, such as 8K, 2K, 1K, etc. or word-interleaving may be used.

Interleaved memory configurations are preferred for their higher bandwidth, since DRAM delays such as due to row precharging can be hidden by overlap with access to a second memory module. Thus the BIOS may choose either 2-way or 4-way interleaved configurations when the memory module under test matches the size of another installed memory module.

In FIG. 8B, the BIOS chooses an interleaved memory configuration. Since all four memory modules have the same size, 128 MB, the BIOS chooses a dual 2-way interleave configuration. The known good memory modules inserted into third and fourth DRAM module slots 566, 568 are interleaved together, so that the copy of the BIOS is stored in both memory modules. Likewise, the known good memory module in first DRAM module slot 562 is interleaved with the memory module under test inserted into test socket 560 for second DRAM module slot 564. Thus the OS image and the test program are stored in both the known good memory module in first DRAM module slot 562, and in the memory module under test in second DRAM module slot 564.

When the memory module under test contains defect 56, and this defect occurs in a portion of memory storing an interleave of the OS image or the test program, the motherboard may crash. The location of defect 56 may not be found by the test program, preventing full diagnosis. This is undesirable.

Figure 9:
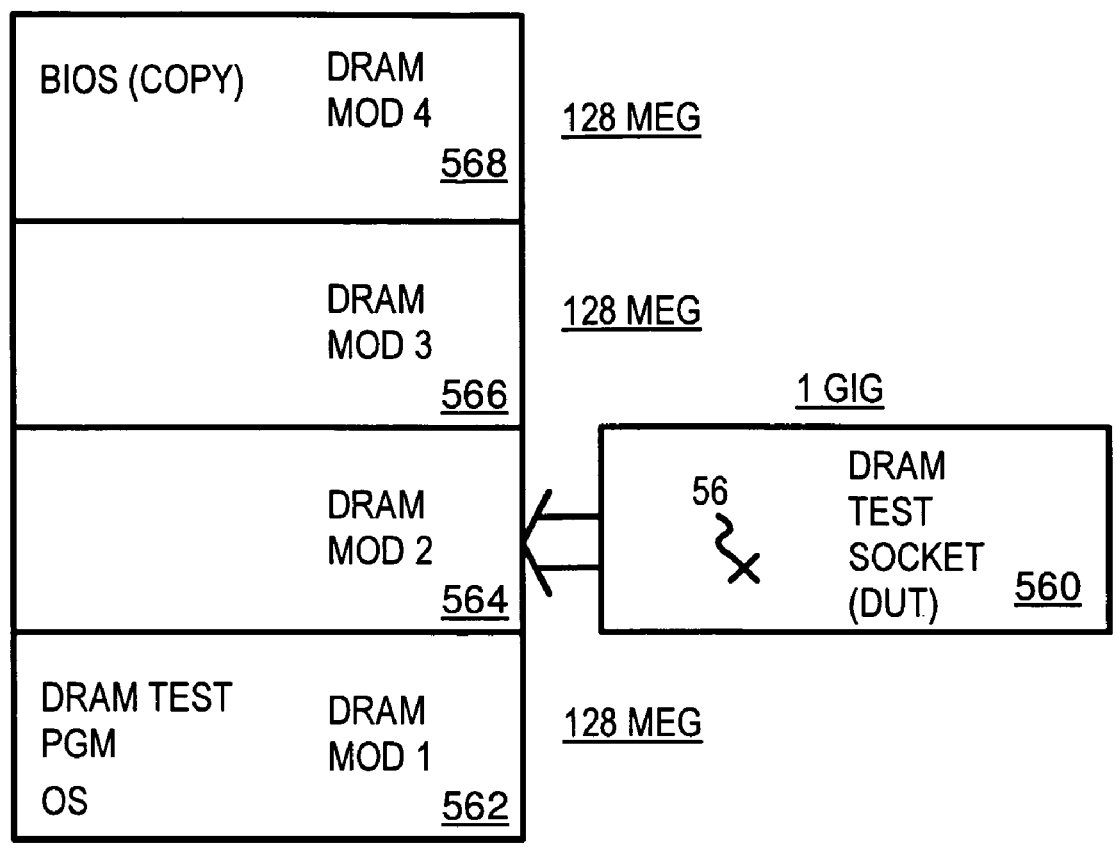
FIG. 9 shows a non-homogenous memory space that avoids the interleaving problem of FIG. 8B.

FIG. 9 shows a non-homogenous memory space that avoids the interleaving problem of FIG. 8B. Rather than populate test socket 560 with the same size of memory module as the known good memory modules in DRAM module slots 562, 566, 568, a different memory module size is used for the memory module under test.

The known good memory modules in DRAM module slots 562, 566, 568 are each 128 MB modules, while the memory module under test inserted into test socket 560 for second DRAM module slot 564 is a 1 GB module. Since the size of the memory module under test mismatches the other memory module sizes, the BIOS cannot choose an interleaved memory configuration that interleaves the memory module under test.

The BIOS may still interleave the third and fourth known-good memory modules installed in DRAM module slots 566, 568, but it cannot interleave the memory module under test in second DRAM module slot 564 with the known good memory module in first DRAM module slot 562. Thus the OS image and the test program are stored only in the known good memory module, not in the memory module under test. The test program can execute without crashing, allowing the location of defect 56 to be found and reported to the host or user.

The user must not insert a 128 MB memory module into test socket 560. However, all other memory module sizes are acceptable. The user could be warned not to test 128 MB memory modules, such as by the host test-system software or diagnosis software. When 128 MB memory modules need to be tested, different known-good memory modules could be installed, such as 512 MB memory modules. Alternately, several motherboards could be available with different sizes of known good memory modules, and the user or robotic handler could route memory modules under test to the correct motherboard for testing.

Figure 10:
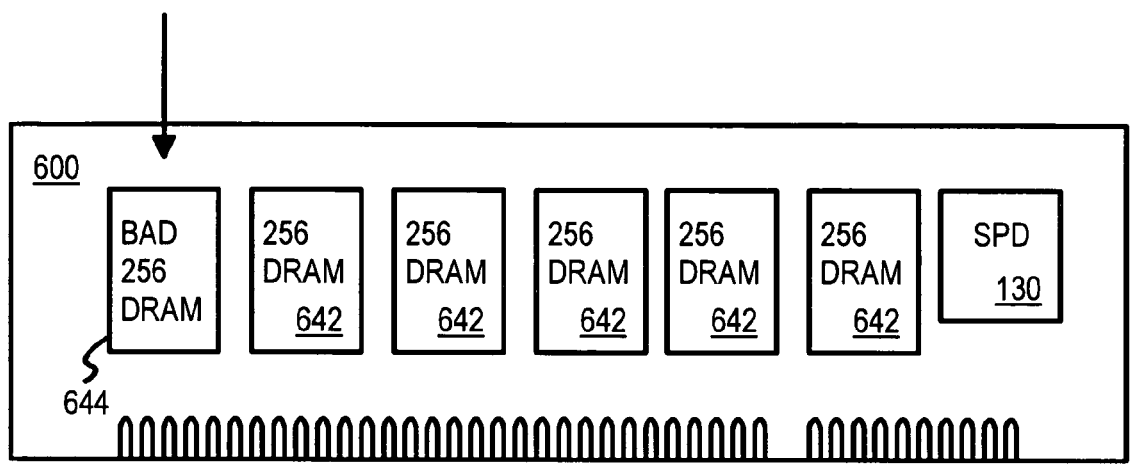
FIG. 10 shows a memory module with a bad DRAM chip identified for rework.

FIG. 10 shows a memory module with a bad DRAM chip identified for rework. During manufacturing, bad memory modules may be identified during testing. These bad memory modules may be collected and moved to a rework area for possible rework and salvage. A technician at the rework area may test all bad memory modules using the diagnostic motherboard tester described herein, with the bad memory module inserted into test socket 560 for a middle address.

This allows the test program to fully execute, testing all memory locations in the bad memory module under test. A map of the defect locations may be generated. The technician may then use the defect map to decide if the bad memory module can be reworked or must be discarded.

The rework technician may use the memory map to determine which of the DRAM chips on the bad memory module is defective. The defective DRAM chip can then be removed by desoldering, and a new DRAM chip can be soldered in its place. The reworked memory module can then be tested and returned to the manufacturing flow.

In FIG. 10, the test program has determined that the defect is inside bad DRAM chip 644. The test program has also determined that no defects are present in the other DRAM chips 642. Module 600 can be reworked by removing bad DRAM chip 644 and replacing it with a new DRAM chip. SPD-EEPROM 130 does not have to be reprogrammed. Overall costs may be reduced by rework since bad memory modules may be fixed and sold.

Production Test Systems

Rather than use an expensive general-purpose I.C. tester, inexpensive testers based on PC motherboards have been developed. These motherboard-based testers cost only about $10K yet can replace a quarter-million-dollar I.C. tester when testing memory modules. The memory module to be tested is inserted into a test socket on a test adapter board (daughter card) mounted on the back-side of the motherboard. The invention described herein can be used with motherboards in such test systems by connecting the test adaptor board to a slot being used for a middle address, and ensuring that it is not interleaved.

Figure 11:
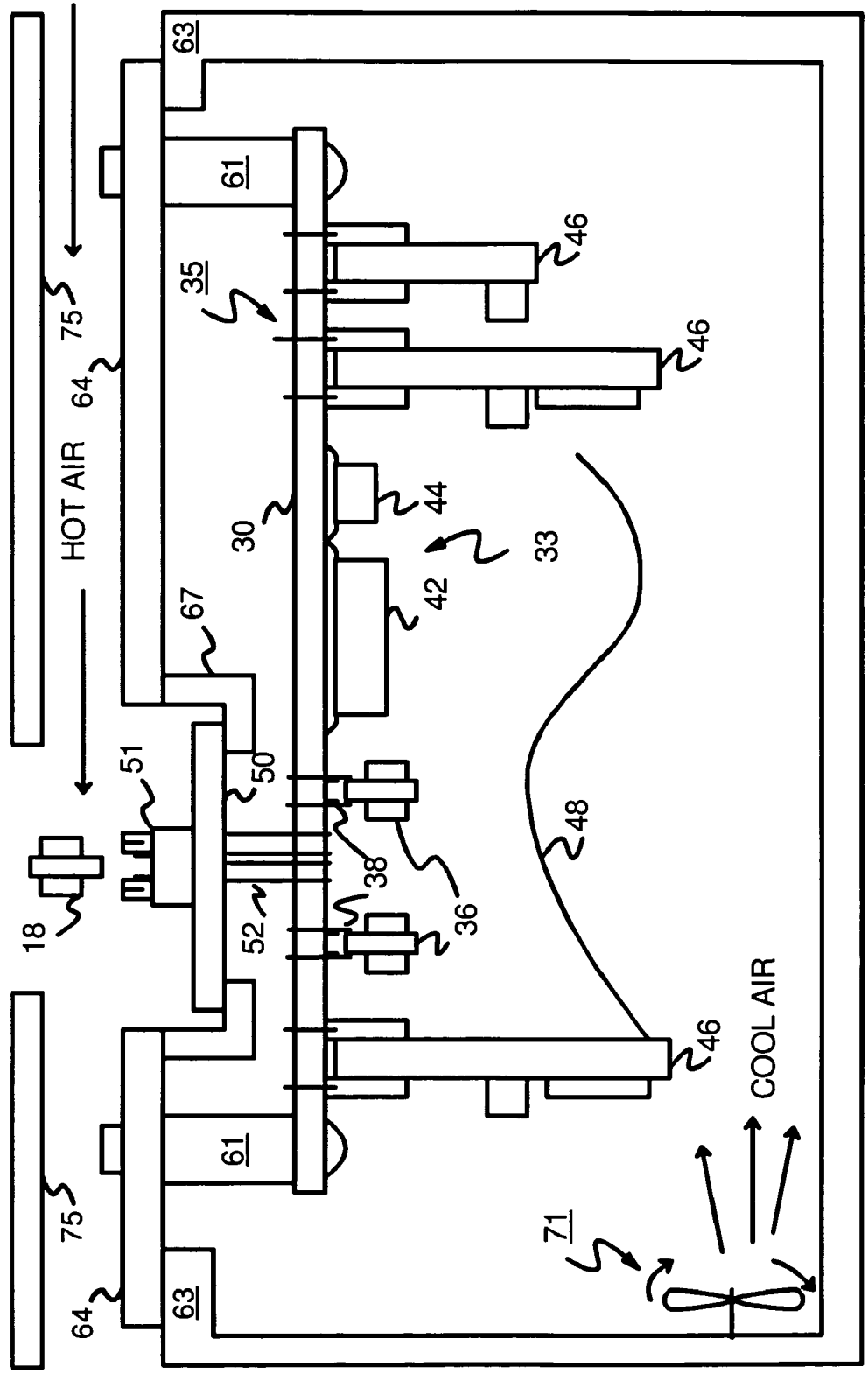
FIG. 11 highlights testing a memory module using a horizontally-mounted motherboard.

FIG. 11 highlights testing a memory module using a horizontally-mounted motherboard. See "Connector Assembly for Testing Memory Modules from the Solder-Side of a PC Motherboard with Forced Hot Air", U.S. Ser. No. 09/702,017, now U.S. Pat. No. 6,357,023. A conventional PC motherboard is mounted horizontally, but upside-down, within chassis 63. Rather than connect motherboard substrate 30 directly to chassis 63, as in a conventional PC, motherboard substrate 30 is mounted to metal plate 64 by standoffs or spacers 61. Motherboard substrate 30 is not mounted directly to chassis 63 in this embodiment, although it could be in some embodiments. Screws, bolts, or clamps (not shown) can be used to secure metal plate 64 to chassis 63.

Test adapter board 50 is mounted to well 67, while well 67 is mounted to metal plate 64. Test socket 51 is mounted to test adapter board 50, while pins 52 provide electrical connection from test socket 51 to motherboard substrate 30. The memory module 18 being tested is inserted into test socket 51. Test adaptor board 50 provides electrical connection from the module-under-test (MUT) in the SIMM/DIMM test socket 51 to the leads for the removed SIMM socket on the PC motherboard.

Motherboard substrate 30 has components 42, 44 (I.C. chips, sockets, capacitors, etc.) mounted on component-side 33 of substrate 30. Memory modules 36 are SIMM or DIMM modules that fit into SIMM/DIMM sockets 38. SIMM/DIMM sockets 38 (hereinafter DIMM sockets 38) have metal pins that fit through holes in substrate 30. Expansion cards 46 are plugged into expansion sockets that are also mounted onto component-side 33 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 63.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for DIMM sockets 38. One or more of DIMM sockets 38 has been removed from the component side of the PC motherboard, leaving the through-holes. Adapter pins 52 are then fitted through the exposed through holes for the removed SIMM socket. Rather than push the pins through from component-side 33, adapter pins 52 are pushed through from solder-side 35 to component-side 33.

Top plate 75 can be mounted to chassis 63 in a variety of ways, such as by standoffs or metal guides or brackets. Top plate 75 has an opening to allow access to test socket 51 so that a robotic arm can insert and remove memory module 18 from test socket 51. Heated air may be blown between top plate 75 and metal plate 64, past memory module 18. Cooling fan 71 is provided in chassis 63 to cool motherboard substrate 30 and its components 42, 44 and expansion cards 46.

A larger chassis with multiple openings on the top, each for holding a metal plate 64 with a horizontally-mounted motherboard and test adapter board can be used. This allows for parallel testing using several motherboards and test sockets.

Figure 12:
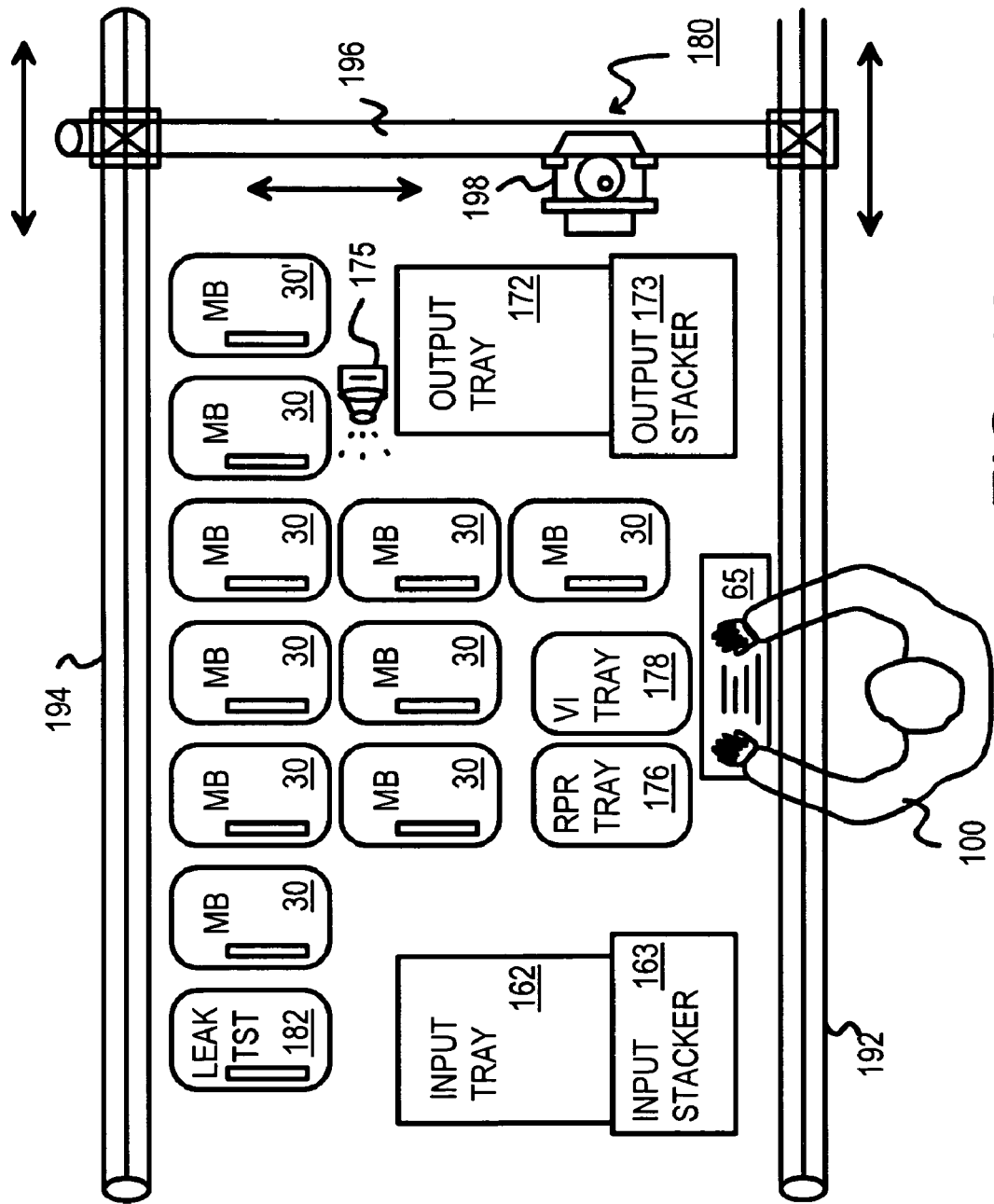
FIG. 12 is an overhead diagram looking down on a multi-motherboard test station with overhead rails for an x-y-z robotic handler.

FIG. 12 is an overhead diagram looking down on a multi-motherboard test station with overhead rails for an x-y-z robotic handler. See Co et al., "Automated Multi-PC-Motherboard Memory-Module Test System with Robotic Handler and In-Transit Visual Inspection", U.S. Pat. No. 6,415,397. Operator 100 can sit in front of the test station, controlling operation with a touch-screen or keyboard. Trays of untested memory modules can include a barcode that is scanned in to main system interface 65 by operator 100 before the tray is put into input stacker 163. Robotic handler 180 then picks untested modules that are moved over to input tray 162 by stacker 163. The modules are first inserted into leakage tester 182. Passing modules are then moved by robotic handler 180 to the test socket on the test adaptor board on the solder-side of one of motherboard substrates 30 for testing.

Modules that fail the motherboard or leakage test are placed on repair tray 176 by robotic handler 180. Modules passing the motherboard test are pulled from the test socket by robotic handler 180 and moved in front of cameras 175 for visual inspection. Modules failing visual inspection are dropped into VI tray 178. Passing modules are placed on output tray 172 and full trays are moved by stacker 173 to the front of the test station where operator 100 can remove them.

Each of the motherboards is mounted horizontally and upside-down and fits into a well in the frame of the test station. The test station has a surface at about bench-top level composed of the exposed solder sides of the motherboards in the wells in the frame. Robotic handler 180 rides on rails 192, 194 mounted above the level of the motherboards, such as above the head of a seated operator 100. Operator 100 also replaces repair tray 176 and VI tray 178 with empty trays when full.

Fixed rails 192, 194 in the x direction allow movable y-rail 196 to travel in the x direction. Robot arm assembly 198 then travels in the y direction along y-rail 196 until robot arm assembly 198 is directly over the desired position, such as a test socket on an adaptor board, or an input or output tray. An elevator arm on robot arm assembly 198 then moves up and down, pulling out (up) a module or inserting a module into (down) a test socket or tray. Robot arm assembly 198 can also rotate or spin the module into the desired position.

Each of motherboard substrates 30 can have a memory module socket on a test adaptor board that connects to a module located at a middle-address, rather than at a high or low address. Then when the memory module under test inserted into the test socket has a fault, the fault can be located by the test program running on that motherboard. The fault does not crash the motherboard. The test system host computer can ensure that memory modules under test are inserted into motherboards having a different size of known good memory modules to prevent interleaving.

Alternate Embodiments

Several other embodiments are contemplated by the inventor. For example, while a single defect 56 in the memory module under test has been described, the test program could locate multiple defects in each memory module under test. Defect types may also be identified by the locations of these defects, such as a column or a row of defects indicating a column or row failure. When all data that passes through a certain I/O pin of a DRAM chip on the memory module under test fails, the failure may be a solder failure that could be fixed or reworked without replacing the DRAM chip. Thus identifying the type of defect may aid in rework operations.

Some motherboards may have multiple memory channels, and the slots may be arranged in some manner that requires interleaving. In that case, two test sockets 560 may be used, each with a memory module under test, to two slots that are interleaved together, but not with any known good memory modules on the motherboard. The slots may be logical slots rather than physical plug-in slots, and are a concept that is useful in explaining memory configurations. Memory buses may be shared or separate.

The number of test sockets on the test adaptor boards could vary, and additional components could be added to the test adaptor boards. Different mounting mechanisms and electrical connections could be used. The motherboard may be substantially perpendicular to the test adaptor board by being at an angle such as from 60 to 120 degrees rather than exactly 90 degrees, or parallel to the test adaptor board.

The memory module socket may be removed and the test adaptor board mounted to the solder side of the motherboard, as described earlier. Alternately, the memory module socket may remain and not be removed. Then the test adaptor board can be a module extender card that is inserted into the memory module socket on the component side of the motherboard. A module extender card contains a test socket at one edge of a small circuit board and contact pads at the opposite edge for insertion into the module socket on the motherboard. The memory module under test is plugged into the test socket of the module extender card. Likewise, the memory module under test can be plugged directly into the module socket on the motherboard without the use of the module extender card.

The test sockets on the test adaptor board can be adapted to take memory components such as DRAM's, thus allowing the testing of memory components in addition to memory modules.

Local heaters for heating the memory module being tested could be mounted on the chassis near the test adaptor boards 50 or on a metal plate that holds the motherboard substrate. A fiberglass board or other insulation that better insulates the motherboard from the elevated temperatures near the test adaptor boards 50 can also be used. A local cooling gun or compressed air rather than a local heater could be substituted to cool the test chamber and the memory module.

Many kinds of memory modules can be tested. Modules using standard DRAM or newer EDO and synchronous DRAM can be tested. Fully-buffered memory modules (FB-DIMM) may also be tested. The system is ideally suited for testing the highest-speed memory modules, since capacitive loading is minimized. Other memories such as RAMBUS modules, DDR modules, and PC133 synchronous modules can be tested.

Various sizes of memory in the memory module, and form factors for memory modules can be used with the invention, limited by the test adaptor board and well size. Different kinds of test adaptor boards can be substituted. The mounting of the motherboard substrates to the test adaptor boards allows a technician or operator to easily replace the test adaptor boards when necessary. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

A Yamaichi type connector could be used as the test socket, but a production-quality connector/socket is preferred due to the low insertion force required. A production quality connector/socket can take more insertions (greater than 100,000 times) than conventional sockets on motherboards (rated for 100 insertions). A production socket also has an ejector normally located at the 2 edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module.

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory module to allow it to be warmed up by the hot air. Memory modules could also be pre-heated by blowing hot air onto modules waiting to be inserted and tested. The input tray could be heated to accomplish this.

One operator may be able to operate several test stations, depending on how quickly trays need to be inserted and removed. Multiple arms can be attached to robot arm assembly 98, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the main system interface.

A network controller card on the ISA or PCI bus that communicates with the main system interface or host can be adapted for other buses and is not limited to existing buses. The controller card can be replaced by a standard parallel or serial-port interface to the main system interface. FireWire, USB, or other emerging standards can be used for the interfaces. Many kinds of robotic arms and tracking systems can be employed, with different degrees of motion. Different grasping technologies can be used to hold the memory modules in the robotic arm. Multiple robotic arms that operate in tandem or independently can be used with the test station. For example, one arm can load modules into the motherboards, while a second arm unloads tested modules.

Memory modules that fail functional testing may be reworked and possibly repaired, such as by replacing a defective DRAM chip or re-soldering a loose connection. A small percentage of the modules, such as 1%, may need to be reworked. However, sometimes the yield of DRAM chips from the wafer fab is low, and failures are more common. A yield-sampling method may be used as an alternative to detect low-yield batches of DRAM chips that may occasionally be received. The sampling method also detects problems with the packaging process.

SPD-EEPROM 130 could be integrated into an Advanced Memory Buffer (AMB) or another buffer chip. SPD-EEPROM 130 may not be present on some types of memory modules. The invention could be applied to unbuffered memory modules, buffered memory modules, Fully-Buffered Dual-Inline Memory Module (FB-DIMM) memory modules, and other kinds of memory modules, including memory modules using future standards.

While DRAM has been described, other kinds of memory could be substituted, such as SRAM, non-volatile memory, or other kinds of memory. The invention may be combined with chip-level redundancy and repair that the DRAM manufacturer performs. Built-in-self-test (BIST) could be used for testing.

Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Muxes and switches could be added to allow for loop-back testing as well as standard operation. Future memory module standards and extensions of the memory module standard could benefit from the invention.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A motherboard-based tester that locates defects in memory modules without crashing comprising:

a test adaptor board, having a test socket for receiving a memory module under test for testing by the motherboard-based tester, the test adaptor board for electrically connecting the memory module under test inserted into the test socket to a motherboard attached to the test adaptor board, the motherboard using the memory module under test inserted into the test socket as a middle portion of a main memory of the motherboard;

the motherboard being a main board for a computer using memory modules as the main memory;

a first module slot on the motherboard, the first module slot connecting to a first memory module socket on a component side of the motherboard and having a first known good memory module inserted;

a second module slot connecting to a location of a second memory module socket on the component side of the motherboard and also connecting to the test adaptor board, wherein the memory module under test inserted into the test socket on the test adaptor board is electrically connected to the second module slot;

a third module slot on the motherboard, the third module slot connecting to a third memory module socket on the component side of the motherboard and having a second known good memory module inserted;

a copy of a basic input-output system (BIOS) stored in the second known good memory module;

an operating system image stored in the first known good memory module;

a test program stored in the first known good memory module, wherein the test program is executed by a processor on the motherboard that causes memory locations in the memory module under test to be written and read without crashing the motherboard; and a defect location within the memory module under test identified by the test program executing on the processor, the defect location being reported to a user, whereby the defect location is identified by the test program without crashing the motherboard by the test program that is not loaded into the memory module under test.

2. The motherboard-based tester of claim 1 wherein the middle portion of the main memory of the motherboard is between memory addresses that access the first known good memory module and the second known good memory module, wherein the memory module under test is accessed by memory addresses between memory addresses that access the first known good memory module and memory addresses that access the second known good memory module.

3. The motherboard-based tester of claim 2 wherein the BIOS is disabled from performing a memory sizing test during booting.

4. The motherboard-based tester of claim 2 wherein the BIOS reads serial-presence-detect memories on the first known good memory module, on the second known good memory module, and on the memory module under test to determine a memory configuration;

wherein the memory module under test is configured to be accessed by middle addresses that do not overlap the copy of the BIOS, the operating system image, or the test program.

5. The motherboard-based tester of claim 2 wherein the memory module under test has a memory size that differs from a memory size of the first and second known good memory modules;

wherein interleaving of the memory module under test is prevented by the memory size being different than memory sizes of the first and second known good memory modules.

6. The motherboard-based tester of claim 2 wherein the first memory module socket and the third memory module socket are mounted to the component side of the motherboard, the component side having integrated circuits mounted thereon and expansion sockets mounted thereon for expansion boards;

wherein the test adaptor board is mounted to a solder side of the motherboard, the solder side being opposite to the component side.

7. The motherboard-based tester of claim 6 further comprising:

a fourth module slot on the motherboard, the fourth module slot connecting to a fourth memory module socket on the component side of the motherboard and having a third known good memory module inserted.

8. The motherboard-based tester of claim 6 further comprising:

a fourth module slot connecting to a location of a fourth memory module socket on the component side of the motherboard and also connecting to the test adaptor board, wherein a second memory module under test inserted into a second test socket on the test adaptor board is electrically connected to the fourth module slot;

wherein the second memory module under test is accessed by memory addresses between memory addresses that access the first known good memory module and memory addresses that access the second known good memory module.

9. The motherboard-based tester of claim 2 wherein the motherboard is in a plurality of motherboards, each motherboard having a test adaptor board and a test socket for testing a memory module under test without crashing;

further comprising:

a diagnostic system interface, coupled to the plurality of motherboards, for commanding the motherboard to test the memory module under test inserted into the test socket and for receiving test results from the motherboard, and a robotic arm, responsive to commands from the diagnostic system interface, for inserting memory modules into the test sockets for use as the memory module under test, whereby the memory modules inserted into the test sockets on the test adaptor boards are tested by motherboards without crashing.

10. The motherboard-based tester of claim 1 wherein the test adaptor board is a module extender card that is inserted into the second memory module socket on the component side of the motherboard.

11. A crash-resistant memory-module tester comprising:

a robotic device that moves memory modules from an input stack of untested memory modules to an output stack of tested memory modules;

a host computer for controlling the robotic device;

a plurality of test stations for testing memory modules that are loaded and unloaded by the robotic device, each test station comprising:

a test adaptor board;

a test socket mounted on the test adaptor board, the test socket for receiving a memory module inserted by the robotic device for use as a memory module under test;

a motherboard for a personal computer, the motherboard executing a test program in response to commands from the host computer, the test program testing the memory module inserted into the test socket;

a first module slot on the motherboard, the first module slot connecting to a first memory module socket on a component side of the motherboard and having a first known good memory module inserted;

a second module slot connecting to a location of a removed second memory module socket on the component side of the motherboard and also connecting to the test adaptor board, wherein the memory module under test inserted into the test socket on the test adaptor board is electrically connected to the second module slot;

a third module slot on the motherboard, the third module slot connecting to a third memory module socket on the component side of the motherboard and having a second known good memory module inserted;

a copy of a basic input-output system (BIOS) stored in the second known good memory module;

an operating system image stored in the first known good memory module; and wherein the test program is stored in the first known good memory module, wherein the test program executed by the motherboard causes memory locations in the memory module under test to be written and read without crashing the motherboard, whereby the memory module under test is tested without crashing the motherboard using the test program that is not loaded into the memory module under test.

12. The crash-resistant memory-module tester of claim 11 wherein a middle portion of a main memory of the motherboard is between memory addresses that access the first known good memory module and the second known good memory module, wherein the memory module under test is accessed by memory addresses between memory addresses that access the first known good memory module and memory addresses that access the second known good memory module.

13. The crash-resistant memory-module tester of claim 12 wherein the memory module under test has a memory size that differs from a memory size of the first and second known good memory modules;
wherein interleaving of the memory module under test is prevented by the memory size being different than memory sizes of the first and second known good memory modules.

14. The crash-resistant memory-module tester of claim 12 wherein each test adaptor board further comprises:
a second test socket mounted on the test adaptor board, the second test socket for receiving a second memory module under test inserted by the robotic device,
wherein the motherboard tests both the memory module under test and the second memory module under test,
whereby two memory modules are tested by each motherboard.

15. The crash-resistant memory-module tester of claim 12 wherein each motherboard further comprises:
a fourth module slot connecting to a location of a removed fourth memory module socket on the component side of the motherboard and also connecting to the test adaptor board, wherein a second memory module under test inserted into a second test socket on the test adaptor board is electrically connected to the fourth module slot;
wherein the second memory module under test is accessed by memory addresses between memory addresses that access the first known good memory module and memory addresses that access the second known good memory module.

16. A reliable multiple-motherboard memory tester comprising:
main system means for controlling testing of memory modules on multiple motherboards;
a plurality of test station means for testing memory modules, each test station means comprising:
test socket means for receiving a memory module under test for testing;
motherboard means, controlled by the main system means, for executing a test program to test a memory module under test inserted into the test socket means; and
test adaptor board means, mounted to the motherboard means, for electrically connecting the test socket means to a memory bus means on the motherboard means;
first module slot means for connecting to a first memory module socket on the motherboard means, and for receiving a first known good memory module inserted;
second module slot means for connecting to a location of a removed second memory module socket on the motherboard means, and for connecting to the test adaptor board means, wherein the memory module under test inserted into the test socket means on the test adaptor board means is electrically connected to the second module slot means;
third module slot means for connecting to a third memory module socket on the motherboard means, and for receiving a second known good memory module inserted;

a copy of a basic input-output system (BIOS) stored in the second known good memory module;
an operating system image stored in the first known good memory module;
wherein the test program is stored in the first known good memory module, wherein the test program executed by the motherboard means causes memory locations in the memory module under test to be written and read without crashing the motherboard means,
wherein the reliable multiple-motherboard memory tester has a plurality of the motherboard means, each motherboard means having an attached test adaptor board means with a test socket means, each motherboard means for executing the test program on a different memory module under test in parallel with other motherboard means;
whereby the memory module under test is tested without crashing the motherboard means using the test program that is not loaded into the memory module under test.

17. The reliable multiple-motherboard memory tester of claim 16 further comprising:
a defect location within the memory module under test identified by the test program executing on the motherboard means, the defect location being reported to the main system means,
whereby the defect location is identified by the test program without crashing the motherboard means by the test program that is not loaded into the memory module under test.

18. The reliable multiple-motherboard memory tester of claim 17 wherein a middle portion of a main memory of the motherboard means is between memory addresses that access the first known good memory module and the second known good memory module,
wherein the memory module under test is accessed by memory addresses between memory addresses that access the first known good memory module and memory addresses that access the second known good memory module.

19. The reliable multiple-motherboard memory tester of claim 18 wherein the memory module under test has a memory size that differs from a memory size of the first and second known good memory modules;
wherein interleaving of the memory module under test is prevented by the memory size being different than memory sizes of the first and second known good memory modules.

20. The reliable multiple-motherboard memory tester of claim 16 further comprising:
robotic means, controlled by the main system means, for grasping a memory module and inserting the memory module into the test socket means, the robotic means also for grasping and removing the memory module from the test socket means after completion of the test program, and moving the memory module to an output means for storing tested memory modules when the motherboard means indicates to the main system means that the memory module has passed the test program,
whereby the memory modules are moved by the robotic means.

* * * * *